United States Patent
Burke

(10) Patent No.: US 11,246,248 B1
(45) Date of Patent: Feb. 8, 2022

(54) ELECTRICAL SHIELDING MATERIAL COMPOSED OF METALLIZED STAINLESS STEEL OR LOW CARBON STEEL MONOFILAMENT YARNS

(71) Applicant: MICROMETAL TECHNOLOGIES, INC, Newburyport, MA (US)

(72) Inventor: Thomas F. Burke, Wayland, MA (US)

(73) Assignee: Micrometal Technologies, Inc., Newburyport, MA (US)

( * ) Notice: Subject to any disclaimer, the term of this patent is extended or adjusted under 35 U.S.C. 154(b) by 0 days.

(21) Appl. No.: 17/226,514

(22) Filed: Apr. 9, 2021

(51) Int. Cl.
    *H05K 9/00* (2006.01)
    *C22C 38/00* (2006.01)

(52) U.S. Cl.
    CPC .......... *H05K 9/0084* (2013.01); *C22C 38/004* (2013.01); *H05K 9/009* (2013.01); *H05K 9/0088* (2013.01)

(58) Field of Classification Search
    CPC .............................. H05K 9/0098; H05K 9/009
    See application file for complete search history.

(56) References Cited

U.S. PATENT DOCUMENTS

| | | | |
|---|---|---|---|
| 4,678,699 A | 7/1987 | Kritchevsky et al. | |
| 5,103,067 A | 4/1992 | Aldissi | |
| 5,180,884 A | 1/1993 | Aldissi | |
| 5,473,113 A | 12/1995 | Aldissi | |
| 7,291,391 B2 | 11/2007 | Watson et al. | |
| 10,314,215 B2 | 6/2019 | Burke et al. | |
| 2005/0006126 A1 | 1/2005 | Aisenbrey | |
| 2007/0000127 A1 | 1/2007 | Bruzek et al. | |
| 2008/0203064 A1 | 8/2008 | Holvoet et al. | |
| 2012/0021218 A1* | 1/2012 | Lee | C23C 18/36 428/395 |
| 2013/0008708 A1 | 1/2013 | Burke | |
| 2015/0159717 A1 | 6/2015 | Jung et al. | |
| 2020/0136105 A1* | 4/2020 | Zhi | H01M 10/0565 |

FOREIGN PATENT DOCUMENTS

JP     2020-21620 A     2/2020

OTHER PUBLICATIONS

ASTM B452-09 (reapproved 2015): Standard Specification for Copper-Clad Steel Wire for Electronic Application.ASTM International, Jun. 20, 2017.

* cited by examiner

*Primary Examiner* — Hung V Ngo
(74) *Attorney, Agent, or Firm* — Preti Flaherty Beliveau & Pachios LLP

(57) ABSTRACT

An RFI/EMI shielding material composed of a conductive multi-fiber having a plurality of metalized monofilaments, each monofilament having a core of stainless steel or low carbon steel with an initial diameter and at least two layers of metal or metal alloy electroplated on the core which is drawn after electroplating to a final diameter less than the initial diameter, in the range of about 45-80 μm.

27 Claims, 4 Drawing Sheets

Plate and Draw Process

ELECTRICAL SHIELDING MATERIAL COMPOSED OF METALLIZED STAINLESS STEEL OR LOW CARBON STEEL MONOFILAMENT YARNS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The invention relates to yarns and multi-fibers comprised of metallized stainless steel or low carbon (mild) steel monofilaments suitable for use as RFI/EMI shielding materials especially for military and aerospace purposes.

As the complexity of electronic systems in aerospace applications has grown, designers of the cables that interconnect system components have been obliged to meet increasingly stringent requirements for RFI/EMI protection and, because aircraft performance and operating cost are directly related to weight, demand for lighter weight cable constructions. For cable assemblies with internal shielding, RFI/EMI protection takes the form of a braided mesh that is applied over the core in the cable manufacturing process (FIG. 1). For cable assemblies without internal shielding, RFI/EMI protection takes the form of a separately produced braided wire mesh sleeve (tubing) that is fitted over a cable or cable bundle (FIG. 2) and grounded by clamping the sleeve ends to the terminating connectors. As such, the sleeve also provides the cable assembly with protection against the aggressive mechanical, thermal, and chemical conditions characteristic of the military/aerospace application environment.

Braided RFI/EMI shielding functions by converting incident electromagnetic energy (which may originate within as well as exterior to the cable) into a current that is carried to ground by the shield; in this regard, the shield acts as both a "transducer" and a "conductor". Shielding effectiveness (SE), a measure of the degree to which incident EMI energy is attenuated by the braided shield, is the resultant of several factors: the resistivity of the shield material; the number of shield layers; and the "optical coverage" or degree to which the braided shield covers the surface compared to an idealized solid cylindrical shield. RFI/EMI energy levels are typically low but braided shielding incorporated into aircraft grounding schemes must also provide enough conductive capacity to withstand lightning strike or electrical fault energies.

Conventional braided shielding is fabricated into flexible tubing from #34 or #36 AWG solid copper wires (0.160 mm or 0.125 mm, 6.3 or 5.0 mils diameter respectively) that are plated with nickel, tin, or silver to provide corrosion protection for the underlying copper. Due to its excellent conductivity, adequate strength, and low cost, plated copper wire has been the "material of choice" in braided tubing designs for many years. However, in a growing number of military/aerospace applications, copper wire-based materials cannot satisfy the more stringent shielding requirements and weight restrictions that are specified in new cable designs. As RFI/EMI frequency increases, its correspondingly shorter wavelengths can leak through the gaps or "windows" in the mesh where the relatively thick ribbons of stiff copper wire intersect. When this occurs, Electromagnetic Compliance (EMC) may necessitate the use of more than one layer of shielding with its attendant weight and stiffness penalties. Moreover, when RFI/EMI induces a current in the shield, the "skin effect" phenomenon confines the current flow to the circumferential surface of the copper wire, which has the effect of rendering the wire core "dead weight". Braided wire mesh fabricated from smaller diameter wires would presumably improve shielding effectiveness as well as reduce cable weight, but copper wires finer than #36 AWG are too prone to breakage in the braiding process.

DISCUSSION OF RELATED ART

One solution to these problems is proposed in U.S. Pat. No. 5,103,067 issued to Aldissi on Jan. 19, 1993 and related U.S. Pat. Nos. 5,180,884 and 5,473,113 wherein the performance and weight-reduction advantages of metal-coated polymeric fibers for internal cable shielding is described. In this approach, yarns of micron-diameter aramid monofilaments having high strength-to-weight ratio and flexibility are metallized with one or more thin layers of conductive material, then braided or knitted into a tight mesh. The high tensile strength of the aramid monofilaments provides mechanical strength in a small diameter form factor that contributes to improved shielding performance by reducing the size of the gaps in the mesh. The flexibility that the polymeric yarns impart to this braided construction also provides greater conformity to the surface of the underlying insulation, thereby expanding the frequency range over which the shielding is effective. Finally, even with its conductive coating, metallized aramid yarn weighs much less than its conventional copper wire counterpart.

Despite these attributes, the metallized aramid yarn noted above does not completely address the needs of cable designers. The chief drawback is its cost—more than 20 times that of conventional plated wire—which effectively limits its use to selected aerospace applications such as satellites and military aircraft where the performance penalty related to excess weight is very high. The high cost of metallized aramid yarn is attributable to its necessary reliance on an electroless deposition process, which is not only much slower but involves much more expensive chemistry than electrolytic methods, to form the first conductive layer on the polymeric monofilaments. Furthermore, although its performance is superior to conventional materials, metallized aramid yarn is not optimal with respect to either coverage or conductivity, two factors that affect shielding effectiveness. Smaller diameter aramid monofilaments would permit braided shields to be made with smaller air gaps, but constructions of metallized aramid yarn are limited to 15 micron diameter monofilaments due to the fact that smaller diameter filaments are embrittled by the amount of plated metal needed to provide sufficiently low resistance for shielding applications, roughly 1 ohm/ft. Consequently, from a conductivity standpoint, yarns comprised of metallized aramid monofilaments have much higher resistance per unit weight properties, in the range of 18 ohms/mg, compared to about 13 ohms/mg for #36 wire or 5 ohms/mg for #34 wire. Finally, the properties of the polymeric monofilaments themselves limit the temperature and chemical exposure that metallized polymeric yarns can reliably withstand.

Accordingly, it would be desirable to employ a simpler, lower cost metallization process to provide a shielding material consisting of a conductive multi-filament yarn having a small form factor (diameter), high conductivity to weight aspect, excellent flexibility, and the ability to withstand a wide range of thermal and chemical exposure. One approach to such an objective is found in U.S. Pat. No. 7,291,391, issued to Watson et al. on Nov. 6, 2007, wherein the use of an electrolytic metallization process to reduce the resistivity of yarns comprised of micron-diameter stainless steel monofilaments is proposed for use as an electrical resistance heating element for heated car seats.

However, the metallized stainless steel yarn proposed in Watson et al. is not suitable for use in cable shielding applications. Its principal deficiency is that the metallized coating is not uniformly applied around the circumference of each monofilament in the yarn bundle. Indeed, as illustrated in the accompanying figures, most of the monofilaments in the interior of the yarn bundle are not metallized at all. Although details about the metallizing process are not presented in the patent, those skilled in the art will recognize that this result is consistent with the use of conventional wire plating methods wherein single strands of wire are pulled under high tension through long plating baths. When such a process is used to plate a multi-filament yarn bundle, particularly one that is tightly twisted, the axial tension in the yarn compresses the bundle and prevents the plating solution from properly wetting the inner filaments. From a functional standpoint, therefore, the un-plated filaments would represent "dead weight" in an airborne application. Moreover, by concentrating the plating activity at the periphery of the yarn bundle, a high tension process makes it very likely that most if not all of the outer filaments will plate together, thus stiffening the yarn bundle and making it behave more like a solid strand of wire in a braided matrix. Finally, since it would be difficult to reliably remove chemicals trapped within the tightly bound yarn bundle, the use of a high tension plating method presents the risk that long-term corrosion sites will be incorporated into the material.

Military/aerospace cable applications also impose rigorous environmental tests (temperature cycling, shock/vibration, etc.) that stress the adhesion of plated metal coatings to their substrate materials (e.g., silver, or tin coatings plated on copper wire). Although it is well-known that stainless steel has an oxidized or "passivated" surface that must be chemically altered or "activated" in order to achieve good adhesion to plated coatings, Watson et al does not prescribe this pre-conditioning step or, for that matter, even a rudimentary cleaning process to remove any residual lubricants or dirt from the wire drawing process itself.

These deficiencies are overcome in the metallized yarn described in U.S. Pat. No. 7,923,390 (390) issued on Apr. 12, 2011 and U.S. Pat. No. 10,314,215 (215) issued on Jun. 4, 2019 to the applicant herein, Burke et al, wherein a low tension/low twist electrolytic plating process provides complete and substantially uniform coatings on each of the stainless steel monofilaments. In present practice the metallized yarn described in these two patents has evolved into a 14 filament construction, each filament comprised of a 35 µm stainless steel core plated with a two-part (strike plus acid) copper layer nominally 4.8 µm thick. The copper-plated core is then over-plated with one or more layers of other metals (e.g. silver, nickel, tin) in various thicknesses to address a variety of application requirements (corrosion resistance, solderability, etc.). As illustrated in these patents, all plating processes are conducted sequentially in a continuous roll-to-roll production line.

However, this single step "plating only" method of producing lightweight RFI/EMI shielding materials is vulnerable to random microscopic plating anomalies that can become sites for corrosion. The most insidious of these anomalies results in adhesion failure between the first metal layer and the stainless steel core of a monofilament, an "early-stage" defect that is impossible to detect in production or even visualize without the aid of a scanning electron microscope (SEM). A SEM photomicrograph of such a defect is shown in FIG. 3. The probable cause is intermittent failure of the surface conditioning chemistry to fully penetrate the yarn bundle and completely "activate" the surfaces of the 316L stainless steel filaments, thereby leaving passivated chromium oxide sites that inhibit robust copper adhesion. Process adjustments have minimized the incidence of these defects but not achieved the goal of eliminating them entirely. Plating anomalies can also occur in the "later stage" plating processes where metals known for corrosion resistance such as nickel, silver, or tin are coated over the copper layers. These anomalies can take the form of inadequate adhesion, leading to poor abrasion resistance and generation of microscopic particles classified as FOD (Foreign Objects and Debris) in the subsequent braiding process. Micropores in insufficiently plated outer layers can also compromise the corrosion resistance of the metallized yarn in marine environments by providing salt water access to the underlying copper layers. "Later stage" defects also include broken filaments or plated-together filaments that expose underlying copper when they are pulled apart in the braiding process.

The use of copper-clad (as opposed to copper-plated) stainless steel filaments has been proposed to eliminate "early stage" defects. In this method, a copper clad stainless steel "source wire" is formed by wrapping copper foil of a pre-determined thickness around a relatively large diameter stainless steel wire and welding the seam prior to feeding the composite into an initial wire drawing facility. The reduced source wire is then transferred to another facility (usually a separate business entity) that specializes in drawing of fine and ultra-fine wire. The copper clad filaments produced in this operation are then transferred to another facility (likewise usually a separate business entity) where they are assembled into yarn bundles for the plating process. Although this three-step ("draw-draw-plate") method eliminates the "early stage" defects mentioned above, it does not address "later stage" plating process defects such as micropores and broken or plated-together filaments.

The method proposed in the allowed U.S. patent application Ser. No. 16/995,406 overcomes these deficiencies by changing the foregoing sequence to one in which the plating process is inserted at an intermediate point prior to, rather than after, the final drawing process. As a result, the plating of various protective layers over the clad copper stainless steel (alternatively low carbon steel) source wire is carried out while the wire is still in a relatively large diameter, single-wire format, not a yarn bundle of delicate, micron-diameter filaments. The plated wire is then transferred to the drawing facility where it is reduced to ultra-fine filament form. Although somewhat more expensive, this three-step "draw-plate-draw" sequence provides several improvements over the foregoing "plate-only" or "draw-plate" methods: by removing ultra-fine filaments from the plating process entirely, it eliminates "later stage" plating defects; its use of wire drawing enhances plated layer adhesion and integrity; and, unexpectedly, it proves to be more efficient in terms of plating capacity utilization.

However, the process proposed in application Ser. No. 16/995,406 does not completely address the evolving demands placed on RFI/EMI shielding materials. Having enjoyed the benefit of substantial (up to 80%) weight savings that the '390/'215 materials provide, some aerospace engineers are now looking for more conductive materials to provide greater lightning strike protection even if it means adding back weight in the form of thicker copper. Conversely, satellite designers are looking for even lighter weight solutions for their microwave applications. As a derivative of utility wire production, copper clad "source wire" is not well-suited to these requirements because industry standards specify the thickness of the copper cladding as a percentage (10%) of the radius of the composite wire. Thus, applicant herein was motivated to devise a cost-effective metallization process that retains the quality improvements of the Ser. No. 16/995,406 application but provides greater flexibility to meet growing demand for customized shielding designs.

BRIEF SUMMARY OF THE INVENTION

The invention provides an RFI/EMI shielding material in the form of a yarn or multi-fiber comprised of a plurality of micron diameter stainless steel monofilaments which have been separately rendered more conductive in the following two-step "plate-draw" process. A stainless steel "source wire" with a diameter larger than 100 µm is fed into a continuous metallization sequence in which the wire surface is first conditioned by cleaning and etching, then electroplated with various metals or metal alloys to prescribed thicknesses. In this sequence the first electroplated layer, which is completely and substantially uniformly disposed over the stainless steel core, is deposited from an alkaline copper solution or, alternatively a Woods nickel solution, both of which promote adhesion to the underlying wire surface. A second electroplated layer, likewise completely and substantially uniformly disposed over the first layer, is next deposited from an acid copper solution. Alternatively, this second layer can be formed from aqueous solutions of other metals or metal alloys known for their conductivity, such as silver or brass. To the extent that these alternative metals or metal alloys also provide good resistance to corrosion and/or compatibility with solder, this layer would be the last in the sequence. In a similar manner, when the second layer is copper, a third layer of metal or metal alloy such as nickel may be electroplated over the second layer to protect the underlying copper from corrosive agents. When the third layer in this multilayer construction consists of nickel, a fourth layer of silver or tin/tin alloy may be added to enhance solderability or serve as a lubricant in the drawing process. The plated composite wire is then transferred to a drawing facility where the diameter of the wire is reduced to an ultra-fine filament size in the range of about 40-80 µm. The filaments are then twisted or bunched together to form a yarn suitable for braiding or weaving into various RFI/EMI shielding articles.

Alternatively, the conductive monofilaments of this invention can be fabricated from low carbon (<0.25%) steel wire that is likewise plated and drawn to the same ultra-fine diameters. Although suitable primarily for applications with reduced tensile strength requirements, these lower cost alternative shielding materials provide comparable improvements in resistance/weight properties as well as improved shielding efficiency at low frequency.

Thus, this two-step process enables the cost-effective production of a wide range of customized RFI/EMI shielding materials that incorporate the advantages of the prior "three-step" Ser. No. 16/995,406 application without its limitations. This more flexible method is further distinguished by the fact that it facilitates the production of certain lightweight configurations that cannot be made by the prior method.

BRIEF DESCRIPTION OF THE SEVERAL VIEWS OF THE DRAWINGS

The invention will be more fully described in the following detailed description taken in conjunction with the accompanying drawings in which.

DETAILED DESCRIPTION OF THE INVENTION

Figure 5:
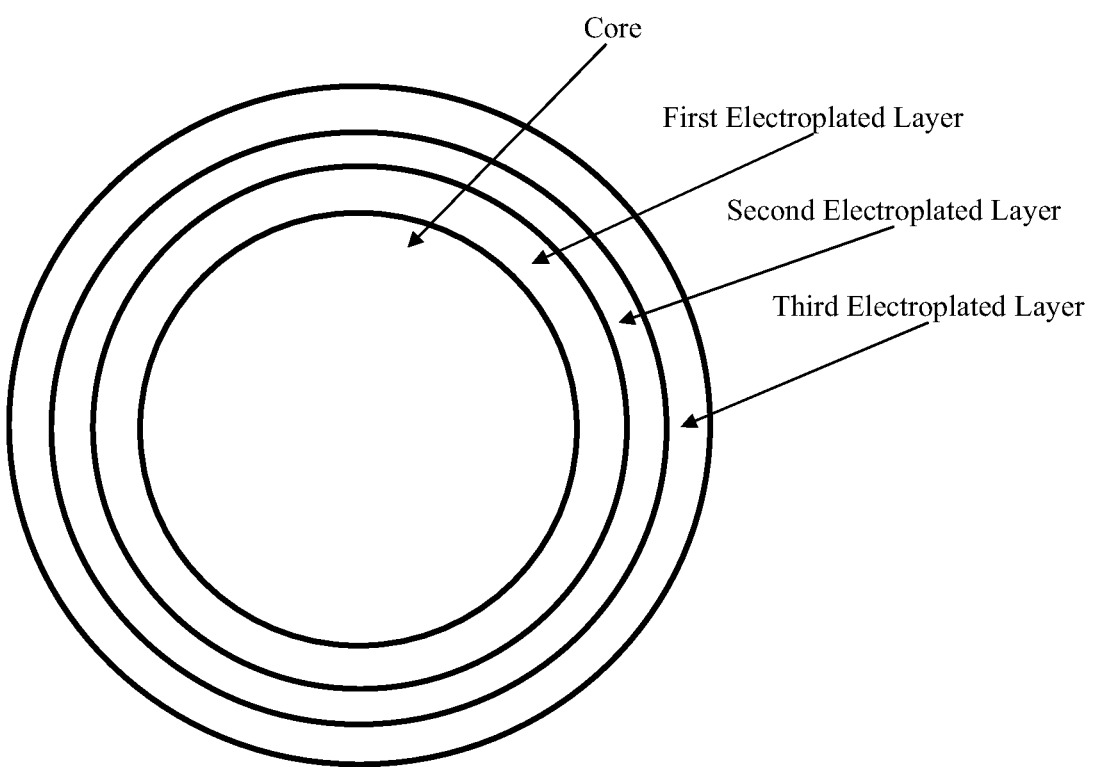
FIG. 5 is an enlarged schematic cross section of a multi-layered monofilament.

A multi-layered monofilament produced in accordance with the invention is illustrated in the enlarged schematic cross section of FIG. 5. Some embodiments described herein have less than all of the layers shown.

The metallized yarn of this invention is fabricated in two steps: an electroplating process followed by a drawing process. This method is differentiated from the three-step "draw-plate-draw" method disclosed in application Ser. No. 16/995,406.

Figure 1:
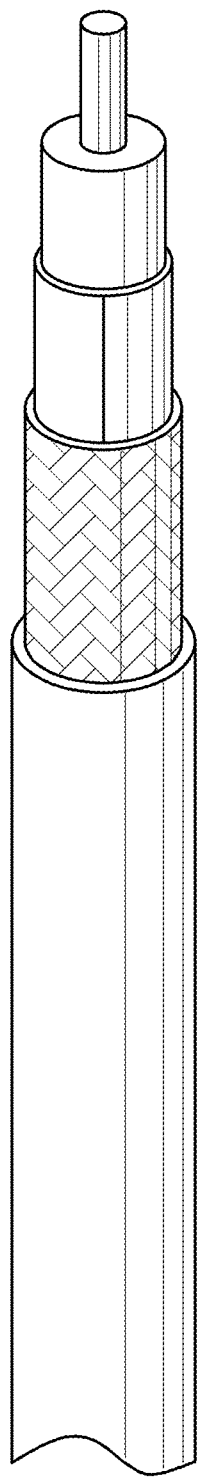
FIG. 1 is a cut-away drawing showing a braided shield in a typical coaxial cable construction (internal shield)
Figure 2:
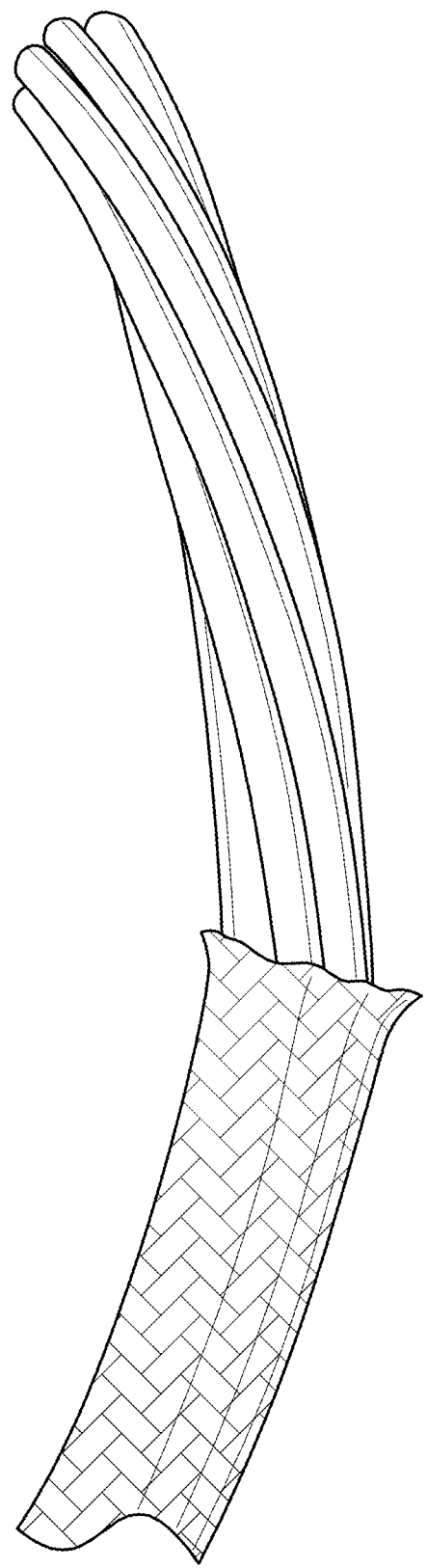
FIG. 2 is an image of a braided shield applied to a group of cables (external shield)
Figure 3:
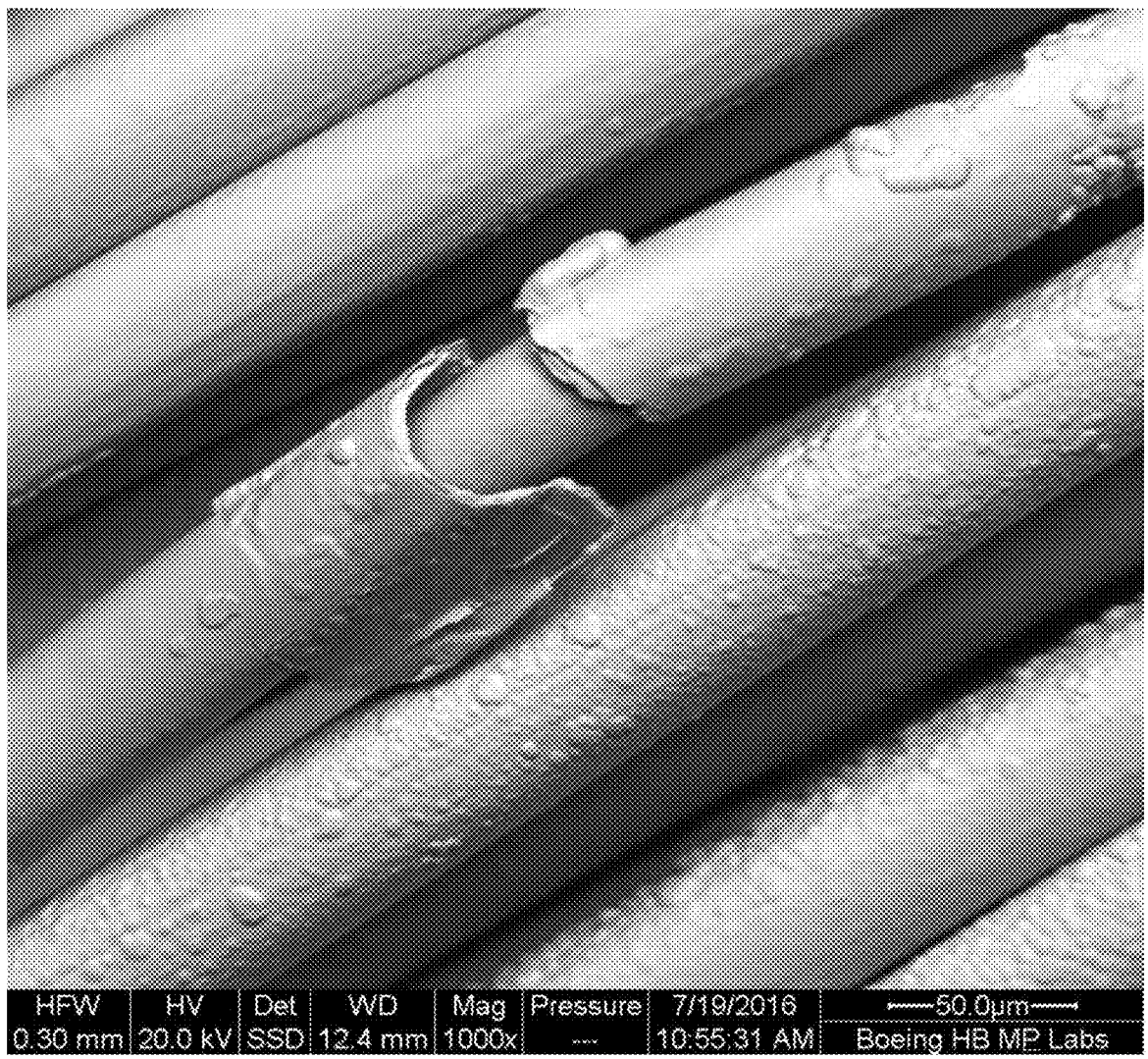
FIG. 3 is a SEM photomicrograph of a '215 "early stage" plating defect
Figure 4:
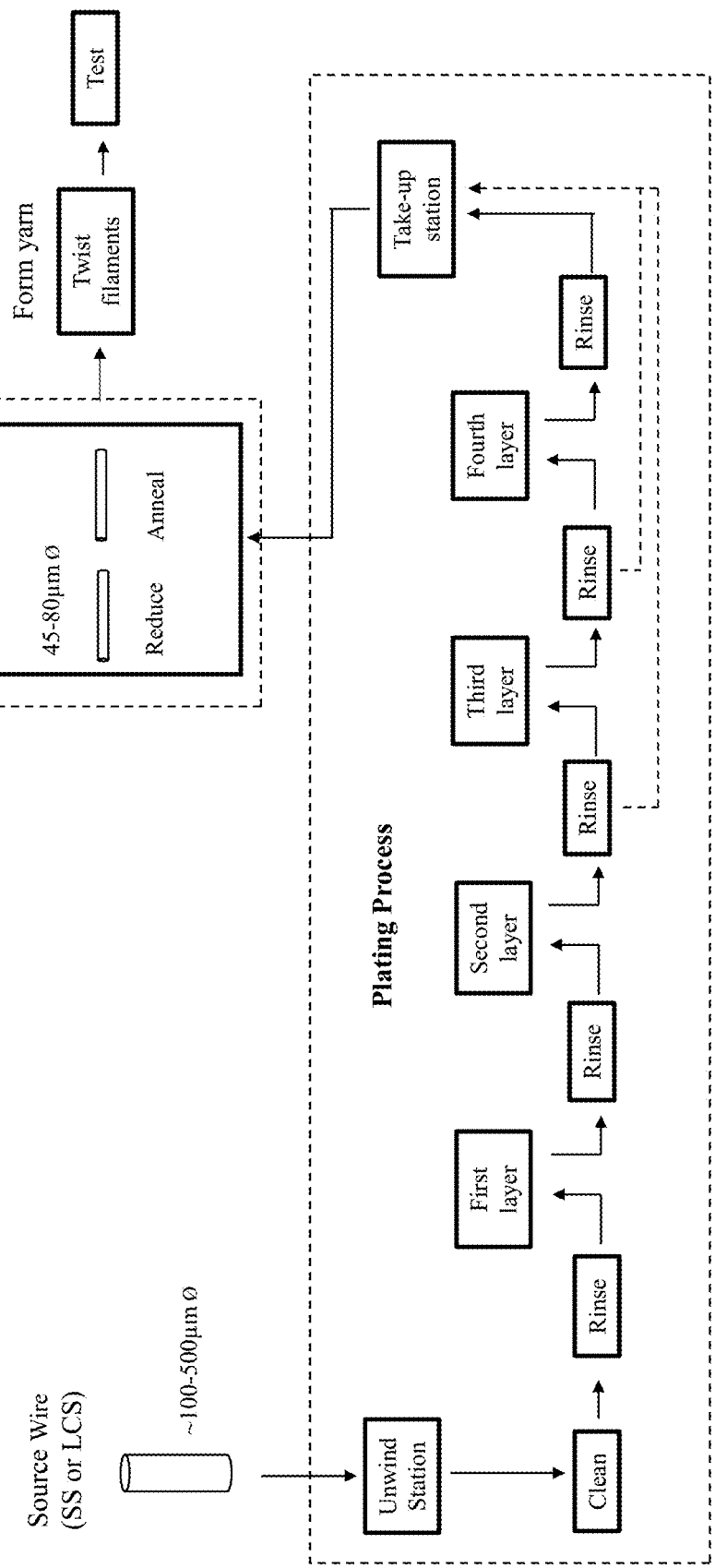
FIG. 4 is a simplified schematic of the steps involved in the electroplating, drawing, and twisting operations.

Plating step. In one preferred embodiment of this first process step, the core of the conductive filaments in the metallized yarn is a "source" wire of stainless steel which is coated with multiple layers of electroplated metal (FIG. 4). A variety of stainless steels can be utilized, preferably 300 series stainless steel is employed and, more preferably, 316L stainless steel for its high tensile strength and elongation properties. The diameter of the stainless steel source wire at this initial point can be almost any commercially available size but is actually determined by the amount of reduction to be performed in the drawing process and the final diameter of the stainless steel core in the drawn filaments. For example, if the final diameter of the stainless core in the drawn filaments is 35 microns, and the reduction provided in the proposed drawing process is 22%, the initial diameter of the stainless core would be 159 microns (35 divided by 0.22). On the other hand, to achieve the same final 35 micron diameter using a drawing process with an overall reduction of 16%, the initial diameter of the stainless steel core would be 219 microns (34 divided by 0.16). Similarly, the thicknesses of the plated layers in the drawn filaments and the overall reduction of the drawing process determine the thickness of any layers to be plated on the stainless steel source wire.

Unwind station. Reels of stainless steel source wire are mounted on spindles which dispense the wire into the plating process under control of a braking device that regulates the back tension on the wire to ensure that the wire conforms to the guide rollers that transport the wire in the prescribed path between the anodes in the plating cells.

Step 1. Clean and rinse. The first step in the process involves the removal of any oils or other organic contaminants from the surface of the stainless steel source wire. There is a wide range of commercially available cleaning solutions that can be employed in this step which is followed by a series of de-ionized (DI) water rinses.

Step 2. Etch and rinse. As is well known to those skilled in the art, it is virtually impossible to achieve high levels of plated metal adhesion to stainless steel surfaces that have not been properly "activated" by the removal of surface oxides, notably chromium oxide. There are a variety of commercially available hydrochloric acid or sulfuric acid formulations suitable for this step. This step is followed by a DI water rinse.

Step 3. First plated layer and rinse. The activated stainless steel wire is then transported into a bath of alkaline copper chemistry where a thin layer of alkaline copper is completely and substantially uniformly electro-deposited on the stainless steel surface. This adhesion-promoting "strike" layer is essential in a plating sequence if the next step is a conventional acid copper plating process because, without this strike layer, the acid copper will "immersion-plate" onto the stainless steel with adhesion so low the deposit can be easily wiped off with a rag. Several proprietary alkaline copper solutions are available for this process step, as well as the well-known but not widely practiced pyrophosphate-copper and cyanide-copper solutions. Since the adhesion-promoting strike layer is typically no thicker than 2,000 Angstroms and thereby relatively resistive, it is necessarily followed by the much thicker deposition of more conductive metals or metal alloys.

Step 4. Second plated layer and rinse. To improve the conductivity of the wire, this step involves the electrolytic deposition of a conductive metal such as copper. An acid copper chemistry is preferred for lowest cost and ease of maintenance, but an alkaline copper chemistry could also be employed. However, this second plated layer can be comprised of any other relatively conductive metal or metal alloy that can be electroplated in an aqueous solution, for example: silver; brass; tin; zinc; bronze; gold, platinum; rhodium; cadmium; and so forth. To ensure complete and substantially uniform plating of the wire, the plating solution is continuously circulated and vigorously agitated by a pumping system that discharges the solution into the plating tank through nozzles (so-called "spargers") arrayed across the bottom of the tank. This step is followed by a thorough rinsing of the wire. In cases wherein the conductive metal layer deposited in this step also has inherent corrosion resistance and/or solderability properties (silver or brass, for example), this would be the last plating step.

Step 5. Third plated layer and rinse. If the stainless steel wire is plated with copper (or other metal with poor corrosion resistance) in the previous step, the exposed copper surface of the drawn filaments must be protected against oxidation and corrosion. Accordingly, the electroplated layer formed in this step would preferably be selected from a list of metals or metal alloys compatible with copper and known to provide good resistance to oxidation and corrosion, among them: nickel; tin; brass; bronze; chromium; and the noble metals, as well as alloys such as tin/lead or tin/silver. It is noteworthy that, in addition to their corrosion resistant properties, several of these metals or metal alloys, notably silver, tin, and tin/lead, would also be preferred in end-use applications where soldering compatibility is a requirement. To ensure complete and substantially uniform plating of the wire, the electrochemical solution in this step is likewise circulated and agitated by means of a sparging system. This step is followed by a thorough rinsing of the wire. When the metal layer deposited in this step is the final layer, the wire is then dried and wound up on a bobbin or reel.

Step 6. Fourth plated layer and rinse. If the foregoing wire metallization consists of a second layer selected for conductivity (copper) and a third layer selected for corrosion protection (nickel), a fourth layer may be required if the end-use application involves soldering because nickel does not provide a readily solderable surface. In this case the electroplated layer formed in this step would preferably be drawn from a list of metals or metal alloys known for solder compatibility, among them silver, tin, tin/lead, and gold. To ensure complete and substantially uniform plating of the wire, the plating solution in this step is likewise circulated and agitated by means of a sparging system. This step is followed by a thorough rinsing of the wire, after which the wire is dried and wound up on a bobbin or reel. The plated stainless steel wire is then transported to the wire drawing process.

In an alternative preferred embodiment all of the foregoing process steps can be replicated with a first plated layer of Woods nickel in lieu of the alkaline copper layer. A Woods nickel plating solution is typically formulated with a relatively high concentration of HCL which provides enhanced adhesion by etching the stainless steel surface.

Either of the two preferred embodiments can be implemented in another preferred embodiment wherein the source wire consists of low (<0.25%) carbon or "mild" steel such as ASTM 1020. Low carbon steel is an attractive alternative to stainless steel in this application: it is more conductive than its stainless steel counterpart, has good ductility for drawing, and is substantially lower in cost. Its only drawback is its tensile strength, roughly 50% that of stainless steel.

As depicted by the alternative paths shown in FIG. 4, a wide range of metallized configurations can be produced in this manner. In one path, for example, the copper-plated stainless steel core is plated with a corrosion-resistant layer of nickel; to provide different levels of corrosion protection, thicker layers can be readily provided by changing the plating process parameters (line speed, rectifier current settings, etc.). Similarly, in another path the copper-plated stainless steel core is plated with a layer of silver or tin/tin alloy to provide a layer that has enhanced solderability as well as corrosion protection. In another path, the stainless steel core is plated with an extra thick second layer of copper, followed by a third layer of a metal known for corrosion resistance or solderability; this construction is useful in applications wherein lower resistivity is desirable for enhanced lightning strike withstand and the added weight of the plated copper layer can be tolerated. In another path the copper-plated stainless steel core is plated with a third layer of nickel followed by a fourth layer of silver over the nickel layer; this construction may be preferred where there is a concern over the long-term diffusion of the copper layer into the silver layer. In another path the strike-plated stainless steel core can be plated with a second and final layer of silver which, in addition to superior high frequency performance, provides corrosion resistance as well as solderability. Ideally suited to space applications, this construction would be intrinsically lighter than its counterpart of the prior '406 application which would be burdened by the weight of a protective layer of nickel or silver over its prescribed clad copper layer. All of these variations can be practiced with mild steel as well.

Drawing step. The plated stainless or mild steel wire is next transferred to the drawing facility where the plated composite is reduced from a wire diameter in about the 150-500 µm range to a filament diameter in about the 45-80 µm range. This ultra-fine drawing process involves one or more sets of drawing stations each of which consists of multiple dies arranged in a sequence of progressively smaller openings that are carefully designed to minimize breakage of the drawn material and consequent rethreading of the die set. As the plated composite wire is pulled through the die openings, the reduction of its component elements under pressure and temperature creates a metallurgical bond at each interface that is significantly stronger than the bond created by electrodeposition alone. The drawing process may involve more than one set of drawing stations and include heat-treating steps between sets.

In the preferred embodiment the drawing process concludes with a final annealing step and to avoid oxidation of the surface of the drawn filaments, such an annealing process would be conducted in an inert atmosphere. The filaments can also be produced in "hard drawn" form, i.e., not annealed, but being somewhat stiffer are less desirable for use in fabricating complex braided articles such as wiring harnesses. As drawn, the multilayer filaments of this invention are produced with extremely smooth, shiny surfaces that are free of corrosion-inducing micropores and, in yarn form, allow the filaments to "nest" or self-adjust to optimize braid "optical coverage", which is an essential element in high frequency shielding efficiency.

Ultrafine wires with diameters below 80 μm are routinely drawn and annealed in the wire industry but this practice is almost exclusively confined to copper and aluminum or alloys thereof with homogenous properties such as tensile strength, ductility, and elongation that have an important influence on die design and processing parameters. Over the years, their growing use in weight-sensitive electronic applications and the proliferation of drawing know-how has served to reduce these materials to near-commodity status with widespread availability from multiple sources.

In contrast, the art of drawing the ultrafine plated stainless steel or plated mild steel filaments of this invention is not well-known or practiced. These multilayer materials are anything but homogeneous: the tensile strength of stainless steel is roughly 4× that of copper while that of mild steel is approximately 2× that of copper; the tensile properties of the plated nickel, silver, tin/tin alloy, or brass layers are quite different from the core materials; the thicknesses and/or number of the plated layers varies from one construction to another; and all of these materials have different annealing profiles. Consequently, the optimum behavior of each construction in the wire drawing process, especially at progressively smaller diameters where breakage potential increases geometrically, can only be determined by extensive trial and error. This necessity, however, is confronted by another reality: despite their suitability for the purposes of this invention, ultrafine filaments incorporating plated stainless or plated mild steel are not particularly useful in other applications due to their fragility and relatively poor conductivity. There has thus been little commercial interest or attention to develop wire drawing technologies for such ultrafine filaments of plated stainless steel or plated mild steel. Nor has there been the recognition of the benefits of such ultrafine filaments of plated stainless steel or plated mild steel, as recognized and implemented by applicant.

Yarn formation. The drawn filaments are then wound on spools and transferred to a twisting process where, in the preferred embodiment, 14 filaments are twisted together to form the conductive yarns of the invention. The filament count can be easily expanded to provide yarns with greater processing efficiency in the braiding process. The twisting process, which serves to hold the delicate yarn filaments together in the braiding or weaving process, imparts a twist of 0.375 tpi (turns per inch); the twist level can be higher or lower, but lower levels invite filament breakage while levels above 2 tpi limit the freedom of the individual filaments to spread out or "nest" in the braid and thereby maximize optical coverage.

Testing. The plated yarn is then subjected to a variety of tests for properties and quality. Electrical resistance tests (ohms/unit length) are performed by wrapping the metallized yarn around two probes set 12 inches apart and measuring the resistance with a Chroma 16502 milli-ohmmeter; ten measurements are taken and averaged. Tensile strength and elongation are measured using an Instron 3342 instrument. Plated metal weight is determined by weighing a precisely cut 3 foot length of yarn in a AND HR-200 gram balance and subtracting the basis weight of the yarn; the result is expressed as a percentage of the total yarn weight. Plated metal adhesion is empirically determined by a tape test; the metal should not flake off or adhere to the tape and any change in resistance should not exceed 10%. Solderability is determined by applying 2-3 drops of Kester 951 flux to a test specimen wrapped around Teflon tubing, submerging the specimen in a pot of molten solder for several seconds, and visually inspecting for solder wetting and adhesion.

This invention can be embodied in a variety of forms as revealed in the following examples:

Example 1

As a point of reference, a 500 ft length of yarn was processed in accordance with the "draw-plate-draw" method described in the Ser. No. 16/995,406 application. In one of the preferred embodiments, a copper-clad stainless steel wire was drawn to an intermediate diameter of 125 um, then transferred to a plating facility where the clad copper layer was electroplated with nickel to a pre-determined thickness. The nickel-plated composite wire was then transferred to an ultra-fine wire drawing facility where the wire was reduced to a 45.4 μm diameter filament comprised of a 35 μm core, a 4.0 μm thick clad copper layer and a 1.2 μm nickel layer. The yarn, which was formed by twisting together 14 filaments, had a resistance of 0.68 ohms/ft and weighed 60.1 mg/ft.

Example 2

As a point of reference, a 500 ft length of yarn was processed in accordance with the "draw-plate-draw" method described in the Ser. No. 16/995,406 application. In one of the alternative preferred embodiments, a copper-clad low carbon steel wire was drawn to an intermediate diameter of 125 um, then transferred to a plating facility where the clad copper layer was electroplated with nickel to a pre-determined thickness. The nickel-plated composite wire was then transferred to an ultra-fine wire drawing facility where the wire was reduced to a 45.4 μm diameter filament comprised of a 35 μm core, a 4 μm thick clad copper layer and a 1.2 μm nickel layer. The yarn, which was formed by twisting together 14 filaments, had a resistance of 0.67 ohms/ft and weighed 60.0 mg/ft.

Example 3

A 500 ft length of yarn was processed in accordance with one of the preferred embodiments of the "plate-draw" method proposed in the present invention. A #34 AWG stainless steel wire with an initial diameter of 160 μm was first cleaned with a New Dimensions Supreme solution (MacDermid), then immersed in an etching solution (Metex 639 from MacDermid) to "activate" the stainless steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of nickel from a nickel sulfamate solution (Barrett SN by MacDermid) to a thickness of approximately 9.1 µm, bringing the overall diameter of the wire to approximately 215.0 µm. The plated composite wire was then transferred to an ultra-fine wire drawing facility where the wire was reduced to a 47.1 µm diameter filament comprised of a 35 µm core, a 0.05 um thick alkaline copper layer, a 4.0 µm thick acid copper layer and a 2.0 µm nickel layer. The yarn, which was formed by twisting together 14 filaments, had a resistance of 0.65 ohms/ft and weighed 64.2 mg/ft.

Example 4

A 500 ft length of yarn was processed in accordance with one of the preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of silver from a proprietary silver solution (Cyless Silver II by Technic) to a thickness of approximately 6.8 µm, bringing the overall diameter of the wire to approximately 210.7 µm. The plated composite wire was then transferred to an ultra-fine wire drawing facility where the wire was reduced to a 46.1 µm diameter filament comprised of a 35 µm core, a 0.05 um thick alkaline copper layer, a 4.0 µm thick acid copper layer and a 1.5 µm silver layer. The yarn, which was formed by twisting together 14 filaments, had a resistance of 0.64 ohms/ft and weighed 63.1 mg/ft.

Example 5

A 500 ft length of yarn was processed in accordance with one of the preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 25.2 µm. The wire was then electroplated with a third layer of nickel from a nickel sulfamate solution (Barrett SN by MacDermid) to a thickness of approximately 9.1 µm, bringing the overall diameter of the wire to approximately 229.8 µm. The plated composite wire was then transferred to an ultra-fine wire drawing facility where the wire was reduced to a 50.1 µm diameter filament comprised of a 35 µm core, a 0.05 um thick alkaline copper layer a 5.5 µm thick acid copper layer and a 2.0 µm nickel layer. The yarn, which was formed by twisting together 14 filaments, had a resistance of 0.58 ohms/ft and weighed 70.9 mg/ft.

Example 6

A 500 ft length of yarn was processed in accordance with one of the preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of nickel from a nickel sulfamate solution (Barrett SN by MacDermid) to a thickness of approximately 5.5 µm. The wire was then electroplated with a fourth layer of silver from a proprietary silver solution (Cyless Silver II by Technic) to a thickness of approximately 1.0 µm, bringing the overall diameter of the wire to approximately 209.6 µm. The plated composite wire was then transferred to an ultra-fine wire drawing facility where the wire was reduced to a 45.9 µm diameter filament comprised of a 35 µm core, a 0.05 um thick alkaline copper layer, a 4.0 µm thick acid copper layer, a 1.2 µm nickel layer and a 0.2 µm silver layer. The yarn, which was formed by twisting together 14 filaments, had a resistance of 0.66 ohms/ft and weighed 61.2 mg/ft.

Example 7

A 500 ft length of yarn was processed in accordance with one of the preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of silver from a proprietary silver solution (Cyless Silver II by Technic) to a thickness of approximately 13.8 µm, bringing the overall diameter of the wire to approximately 187.8 µm. The plated composite wire was then transferred to an ultra-fine wire drawing facility where the wire was reduced to a 41.1 µm diameter filament comprised of a 35 µm core, a 0.05 um thick alkaline copper layer and a 3.0 µm thick silver layer. The yarn, which was formed by twisting together 14 filaments, had a resistance of 0.64 ohms/ft and weighed 51.4 mg/ft. This lightweight construction cannot be replicated using the "draw-plate-draw" process because the first layer in that process involves a clad copper layer 4.0 um thick which requires an additional layer of a corrosion resistant metal to protect the copper.

Example 8

A 500 ft length of yarn was processed in accordance with one of the alternative preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of nickel from a Woods nickel solution to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of nickel from a nickel sulfamate solution (Barrett SN by MacDermid) to a thickness of approximately 9.1 µm, bringing the overall diameter of the wire to approximately 215.0 µm. The plated composite wire was then transferred to an ultra-fine wire drawing facility where the wire was reduced to a 47.1 µm diameter filament comprised of a 35 µm core, a 0.05 um thick Woods nickel layer, a 4.0 µm thick copper layer and a 2.0 µm nickel layer. The yarn, which was formed by twisting together 14 filaments, had a resistance of 0.65 ohms/ft and weighed 64.2 mg/ft.

Example 9

A 500 ft length of yarn was processed in accordance with one of the alternative preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of nickel from a Woods nickel solution to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of silver from a proprietary silver solution (Cyless Silver II by Technic) to a thickness of approximately 6.8 µm, bringing the overall diameter of the wire to approximately 210.4 µm. The plated composite wire was then transferred to an ultra-fine wire drawing facility where the wire was reduced to a 46.1 µm diameter filament comprised of a 35 µn core, a 0.05 um thick Woods nickel layer, a 4.0 µm thick copper layer and a 1.5 µm silver layer. The yarn, which was formed by twisting together 14 filaments, had a resistance of 0.64 ohms/ft and weighed 63.1 mg/ft.

Example 10

A 500 ft length of yarn was processed in accordance with one of the alternative preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of nickel from a Woods nickel solution to a thickness of approximately 0.2 um. The wire was next electroplated with a second layer of copper from an acid copper sulfate solution (Isobrite by MacDermid) to a thickness of approximately 25.2 µm. The wire was then electroplated with a third layer of nickel from a nickel sulfamate solution (Barrett SN by MacDermid) to a thickness of approximately 9.1 µm, bringing the overall diameter of the wire to approximately 229.8 µm. The plated composite wire was then transferred to an ultra-fine wire drawing facility where the wire was reduced to a 50.1 µm diameter filament comprised of a 35 µm core, a 0.05 um thick Woods nickel layer, a 5.5 µm thick copper layer and a 2.0 µm nickel layer. The yarn, which was formed by twisting together 14 filaments, had a resistance of 0.58 ohms/ft and weighed 70.9 mg/ft.

Example 11

A 500 ft length of yarn was processed in accordance with one of the alternative preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of nickel from a Woods nickel solution to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of nickel from a nickel sulfamate solution (Barrett SN by MacDermid) to a thickness of approximately 5.5 µm. The wire was then electroplated with a fourth layer of silver from a proprietary silver solution (Cyless Silver II by Technic) to a thickness of approximately 1.0 µm, bringing the overall diameter of the wire to approximately 209.6 µm. The plated composite wire was then transferred to an ultra-fine wire drawing facility where the wire was reduced to a 45.9 µm diameter filament comprised of a 35 µm core, a 0.05 um thick Woods nickel layer, a 4.0 µm thick copper layer, a 1.2 µm nickel layer and a 0.2 µm silver layer. The yarn, which was formed by twisting together 14 filaments, had a resistance of 0.66 ohms/ft and weighed 61.2 mg/ft.

Example 12

A 500 ft length of yarn was processed in accordance with one of the alternative preferred embodiments of the "plate-draw" method proposed in the present invention. A #34 AWG stainless steel wire with an initial diameter of 160 µm was first cleaned with a New Dimensions Supreme solution (MacDermid), then immersed in an etching solution (Metex 639 from MacDermid) to "activate" the stainless steel surface. The wire was then plated with a first layer of nickel from a Woods nickel solution to a thickness of approximately 0.2 um. The wire was next electroplated with a second layer of silver from a proprietary silver solution (Cyless Silver II by Technic) to a thickness of approximately 13.8 µm, bringing the overall diameter of the wire to approximately 187.8 µm. The plated composite wire was then transferred to an ultra-fine wire drawing facility where the wire was reduced to a 41.1 µm diameter filament comprised of a 35 µm core, a 0.05 um thick Woods nickel layer, and a 3.0 µm thick silver layer. The yarn, which was formed by twisting together 14 filaments, had a resistance of 0.64 ohms/ft and weighed 51.4 mg/ft. This lightweight construction cannot be replicated using the "draw-plate-draw" process because the first layer in that process involves a clad copper layer 4.0 um thick which requires an additional layer of a corrosion resistant metal to protect the copper.

Example 13

A 500 ft length of yarn was processed in accordance with one of the alternative preferred embodiments of the "plate-draw" method proposed in the present invention. A #34 AWG low carbon steel wire with an initial diameter of 160 μm was first cleaned with a New Dimensions Supreme solution (MacDermid), then immersed in an etching solution (Metex 639 from MacDermid) to remove residual oxides from the low carbon steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 18.3 μm. The wire was then electroplated with a third layer of nickel from a nickel sulfamate solution (Barrett SN by MacDermid) to a thickness of approximately 9.1 μm, bringing the overall diameter of the wire to approximately 215.0 μm. The plated composite wire was then transferred to an ultra-fine wire drawing facility where the wire was reduced to a 47.1 μm diameter filament comprised of a 35 μm core, a 0.05 um thick alkaline copper layer, a 4.0 μm thick copper layer and a 2.0 μm nickel layer. The yarn, which was formed by twisting together 14 filaments, had a resistance of 0.65 ohms/ft and weighed 64.2 mg/ft.

Example 14

A 500 ft length of yarn was processed in accordance with one of the alternative preferred embodiments of the "plate-draw" method proposed in the present invention. A #34 AWG low carbon steel wire with an initial diameter of 160 μm was first cleaned with a New Dimensions Supreme solution (MacDermid), then immersed in an etching solution (Metex 639 from MacDermid) to remove residual oxides from the low carbon steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 18.3 μm. The wire was then electroplated with a third layer of silver from a proprietary silver solution (Cyless Silver II by Technic) to a thickness of approximately 6.8 μm, bringing the overall diameter of the wire to approximately 210.4 μm. The plated composite wire was then transferred to an ultra-fine wire drawing facility where the wire was reduced to a 46.1 μm diameter filament comprised of a 35 μm core, a 0.05 um thick alkaline copper layer, a 4.0 μm thick copper layer and a 1.5 μm silver layer. The yarn, which was formed by twisting together 14 filaments, had a resistance of 0.64 ohms/ft and weighed 63.1 mg/ft.

Example 15

A 500 ft length of yarn was processed in accordance with one of the alternative preferred embodiments of the "plate-draw" method proposed in the present invention. A #34 AWG low carbon steel wire with an initial diameter of 160 μm was first cleaned with a New Dimensions Supreme solution (MacDermid), then immersed in an etching solution (Metex 639 from MacDermid) to remove residual oxides from the low carbon steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 25.0 μm. The wire was then electroplated with a third layer of nickel from a nickel sulfamate solution (Barrett SN by MacDermid) to a thickness of approximately 9.1 μm, bringing the overall diameter of the wire to approximately 229.8 μm. The plated composite wire was then transferred to an ultra-fine wire drawing facility where the wire was reduced to a 50.1 μm diameter filament comprised of a 35 μm core, a 0.05 um thick alkaline copper layer, a 5.5 μm thick copper layer and a 2.0 μm nickel layer. The yarn, which was formed by twisting together 14 filaments, had a resistance of 0.58 ohms/ft and weighed 70.9 mg/ft.

Example 16

A 500 ft length of yarn was processed in accordance with one of the alternative preferred embodiments of the "plate-draw" method proposed in the present invention. A #34 AWG low carbon steel wire with an initial diameter of 160 μm was first cleaned with a New Dimensions Supreme solution (MacDermid), then immersed in an etching solution (Metex 639 from MacDermid) to remove residual oxides from the low carbon steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of copper from an acid copper sulfate solution (Isobrite by MacDermid) to a thickness of approximately 18.3 μm. The wire was then electroplated with a third layer of nickel from a nickel sulfamate solution (Barrett SN by MacDermid) to a thickness of approximately 5.5 μm. The wire was then electroplated with a fourth layer of silver from a proprietary silver solution (Cyless Silver II by Technic) to a thickness of approximately 1.0 μm, bringing the overall diameter of the wire to approximately 209.6 μm. The plated composite wire was then transferred to an ultra-fine wire drawing facility where the wire was reduced to a 45.9 μm diameter filament comprised of a 35 μm core, a 0.05 um thick alkaline copper layer a 4.0 μm thick copper layer, a 1.2 μm nickel layer and a 0.2 μm silver layer. The yarn, which was formed by twisting together 14 filaments, had a resistance of 0.66 ohms/ft and weighed 61.2 mg/ft.

Example 17

A 500 ft length of yarn was processed in accordance with one of the alternative preferred embodiments of the "plate-draw" method proposed in the present invention. A #34 AWG low carbon steel wire with an initial diameter of 160 μm was first cleaned with a New Dimensions Supreme solution (MacDermid), then immersed in an etching solution (Metex 639 from MacDermid) to remove residual oxides from the low carbon steel surface. The wire was then plated with a first layer of copper from a proprietary alkaline copper solution (E-Brite Ultra Cu by Electrochemical Products, Inc.) to a thickness of approximately 0.2 um. The wire was next electroplated with a second layer of silver from a proprietary silver solution (Cyless Silver II by Technic) to a thickness of approximately 13.8 μm, bringing the overall diameter of the wire to approximately 187.8 μm. The plated composite wire was then transferred to an ultra-fine wire drawing facility where the wire was reduced to a 41.1 μm diameter filament comprised of a 35 μm core, a 0.05 um thick alkaline copper layer, and a 3.0 μm thick silver layer. The yarn, which was formed by twisting together 14 filaments, had a resistance of 0.64 ohms/ft and weighed 51.4 mg/ft. This lightweight construction cannot be replicated using the "draw-plate-draw" process because the first layer in that process involves a clad copper layer 4.0 um thick which requires an additional layer of a corrosion resistant metal to protect the copper.

Example 18

A 500 ft length of yarn was processed in accordance with one of the alternative preferred embodiments of the "plate-draw" method proposed in the present invention. A #34 AWG low carbon steel wire with an initial diameter of 160 µm was first cleaned with a New Dimensions Supreme solution (MacDermid), then immersed in an etching solution (Metex 639 from MacDermid) to remove residual oxides from the low carbon steel surface. The wire was then plated with a first layer of nickel from a Woods nickel solution to a thickness of 0.2 um. The wire was next electroplated with a second layer of copper from an acid copper sulfate solution (Isobrite by MacDermid) to a thickness of approximately 18.3 µm. The wire was then electroplated with a third layer of nickel from a nickel sulfamate solution (Barrett SN by MacDermid) to a thickness of approximately 9.1 µm, bringing the overall diameter of the wire to approximately 215.0 µm. The plated composite wire was then transferred to an ultra-fine wire drawing facility where the wire was reduced to a 47.1 µm diameter filament comprised of a 35 µm core, a 0.05 um thick Woods nickel layer, a 4.0 µm thick copper layer and a 2.0 µm nickel layer. The yarn, which was formed by twisting together 14 filaments, had a resistance of 0.65 ohms/ft and weighed 64.2 mg/ft.

Example 19

A 500 ft length of yarn was processed in accordance with one of the alternative preferred embodiments of the "plate-draw" method proposed in the present invention. A #34 AWG low carbon steel wire with an initial diameter of 160 µm was first cleaned with a New Dimensions Supreme solution (MacDermid), then immersed in an etching solution (Metex 639 from MacDermid) to remove residual oxides from the low carbon steel surface. The wire was then plated with a first layer of nickel from a Woods nickel solution to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of silver from a proprietary silver solution (Cyless Silver II by Technic) to a thickness of approximately 6.8 µm, bringing the overall diameter of the wire to approximately 210.4 µm. The plated composite wire was then transferred to an ultra-fine wire drawing facility where the wire was reduced to a 46.1 µm diameter filament comprised of a 35 µm core, a 0.05 um thick Woods nickel layer, a 4.0 µm thick copper layer and a 1.5 µm silver layer. The yarn, which was formed by twisting together 14 filaments, had a resistance of 0.64 ohms/ft and weighed 63.1 mg/ft.

Example 20

A 500 ft length of yarn was processed in accordance with one of the alternative preferred embodiments of the "plate-draw" method proposed in the present invention. A #34 AWG low carbon steel wire with an initial diameter of 160 µm was first cleaned with a New Dimensions Supreme solution (MacDermid), then immersed in an etching solution (Metex 639 from MacDermid) to remove residual oxides from the low carbon steel surface. The wire was then plated with a first layer of nickel from a Woods nickel solution to a thickness of approximately 0.2 um. The wire was next electroplated with a second layer of copper from an acid copper sulfate solution (Isobrite by MacDermid) to a thickness of approximately 25.2 µm. The wire was then electroplated with a third layer of nickel from a nickel sulfamate solution (Barrett SN by MacDermid) to a thickness of approximately 9.1 µm, bringing the overall diameter of the wire to approximately 229.8 µm. The plated composite wire was then transferred to an ultra-fine wire drawing facility where the wire was reduced to a 50.1 µm diameter filament comprised of a 35 µm core, a 0.05 um thick Woods nickel layer, a 5.5 µm thick copper layer and a 2.0 µm nickel layer. The yarn, which was formed by twisting together 14 filaments, had a resistance of 0.58 ohms/ft and weighed 70.9 mg/ft.

Example 21

A 500 ft length of yarn was processed in accordance with one of the alternative preferred embodiments of the "plate-draw" method proposed in the present invention. A #34 AWG low carbon steel wire with an initial diameter of 160 µm was first cleaned with a New Dimensions Supreme solution (MacDermid), then immersed in an etching solution (Metex 639 from MacDermid) to remove residual oxides from the low carbon steel surface. The wire was then plated with a first layer of nickel from a Woods nickel solution to a thickness of approximately 0.2 um. The wire was next electroplated with a second layer of copper from an acid copper sulfate solution (Isobrite by MacDermid) to a thickness of approximately 18.3 µm. The wire was then electroplated with a third layer of nickel from a nickel sulfamate solution (Barrett SN by MacDermid) to a thickness of approximately 5.5 µm. The wire was then electroplated with a fourth layer of silver from a proprietary silver solution (Cyless Silver II by Technic) to a thickness of approximately 1.0 µm, bringing the overall diameter of the wire to approximately 209.6 µm. The plated composite wire was then transferred to an ultra-fine wire drawing facility where the wire was reduced to a 45.9 µm diameter filament comprised of a 35 µm core, a 0.05 um thick Woods nickel layer, a 4.0 µm thick copper layer, a 1.2 µm nickel layer and a 0.2 µm silver layer. The yarn, which was formed by twisting together 14 filaments, had a resistance of 0.66 ohms/ft and weighed 61.2 mg/ft.

Example 22

A 500 ft length of yarn was processed in accordance with one of the alternative preferred embodiments of the "plate-draw" method proposed in the present invention. A #34 AWG low carbon steel wire with an initial diameter of 160 µm was first cleaned with a New Dimensions Supreme solution (MacDermid), then immersed in an etching solution (Metex 639 from MacDermid) to remove residual oxides from the low carbon steel surface. The wire was then plated with a first layer of nickel from a Woods nickel solution to a thickness of approximately 0.2 um. The wire was next electroplated with a second layer of silver from a proprietary silver solution (Cyless Silver II by Technic) to a thickness of approximately 13.8 µm, bringing the overall diameter of the wire to approximately 187.8 µm. The plated composite wire was then transferred to an ultra-fine wire drawing facility where the wire was reduced to a 41.1 µm diameter filament comprised of a 35 µm core, a 0.05 um thick Woods nickel layer, and a 3.0 µm thick silver layer. The yarn, which was formed by twisting together 14 filaments, had a resistance of 0.64 ohms/ft and weighed 51.4 mg/ft. This lightweight construction cannot be replicated using the "draw-plate-draw" process because the first layer in that process involves a clad copper layer 4.0 um thick which requires an additional layer of a corrosion resistant metal to protect the copper.

Accordingly, the invention is not to be limited to what has been particularly shown and described and is to include the full spirit and scope of the appended claims.

What is claimed is:

1. An RFI/EMI shielding material composed of a conductive multi-fiber having a plurality of metalized monofilaments, each monofilament including:
  a core of stainless steel with an initial diameter;
  a first electroplated layer of copper deposited from an alkaline copper solution and completely and substantially uniformly electroplated on the stainless steel core;
  a second layer of metal or metal alloy completely and substantially uniformly electroplated on the first electroplated copper layer and which is resistant to oxidation and corrosion or to which solder can bond;
  wherein each monofilament is drawn after electroplating to a final diameter less than the initial diameter.

2. The RFI/EMI shielding material of claim 1 wherein the core of stainless steel has an initial diameter larger than 100 µm and wherein the final diameter of each monofilament is in the range of about 40-80 µm.

3. The RFI/EMI shielding material of claim 1 wherein the second electroplated layer is chosen from the group consisting of silver, nickel, tin/tin alloy, brass, bronze, and noble metal.

4. A braided shielding made from the shielding material of claim 1.

5. An RFI/EMI shielding material composed of a conductive multi-fiber having a plurality of metalized monofilaments, each monofilament including:
  a core of stainless steel with an initial diameter;
  a first electroplated layer of copper deposited from an alkaline copper solution and completely and substantially uniformly electroplated on the stainless steel core;
  a second layer of copper deposited from an acid copper or alkaline copper solution and completely and substantially uniformly electroplated on the first electroplated copper layer;
  a third layer of metal or metal alloy completely and substantially uniformly electroplated on the second layer and which is resistant to oxidation and corrosion or to which solder can bond;
  wherein each monofilament is drawn after electroplating to a final diameter less than the initial diameter.

6. The RFI/EMI shielding material of claim 5 wherein the third electroplated layer is chosen from the group consisting of silver, nickel, tin/tin alloy, brass, and noble metal.

7. The RFI/EMI shielding material of claim 5 wherein each of the monofilaments has a fourth electroplated layer of electroplatable metal or metal alloy to which solder can bond.

8. The RFI/EMI shielding material of claim 7 wherein the fourth electroplated layer is chosen from the group consisting of silver, tin/tin alloy, brass, and gold.

9. An RFI/EMI shielding material composed of a conductive multi-fiber having a plurality of metalized monofilaments, each monofilament including:
  a core of stainless steel with an initial diameter;
  a first electroplated layer of nickel deposited from a Woods nickel solution and completely and substantially uniformly electroplated on the stainless steel core;
  a second layer of metal or metal alloy completely and substantially uniformly electroplated on the first electroplated layer and which is resistant to oxidation and corrosion or to which solder can bond;
  wherein each monofilament is drawn after electroplating to a final diameter less than the initial diameter.

10. The RFI/EMI shielding material of claim 9 wherein the second electroplated layer is chosen from the group consisting of silver, tin/tin alloy, brass, bronze, and noble metal.

11. An RFI/EMI shielding material composed of a conductive multi-fiber having a plurality of metalized monofilaments, each monofilament including:
  a core of stainless steel with an initial diameter;
  a first electroplated layer of nickel deposited from a Woods nickel solution and completely and substantially uniformly electroplated on the stainless steel core;
  a second layer of copper deposited from an acid copper or alkaline copper solution and completely and substantially uniformly electroplated on the first electroplated layer;
  a third layer of metal or metal alloy completely and substantially uniformly electroplated on the second layer and which is resistant to oxidation and corrosion or to which solder can bond;
  wherein each monofilament is drawn after electroplating to a final diameter less than the initial diameter.

12. The RFI/EMI shielding material of claim 11 wherein the third electroplated layer is chosen from the group consisting of silver, nickel, tin/tin alloy, brass, and noble metal.

13. The RFI/EMI shielding material of claim 11 wherein each of the monofilaments has a fourth electroplated layer of electroplatable metal or metal alloy to which solder can bond.

14. The RFI/EMI shielding material of claim 13 wherein the fourth electroplated layer is chosen from the group consisting of silver, tin/tin alloy, brass, and gold.

15. An RFI/EMI shielding material composed of a conductive multi-fiber having a plurality of metalized monofilaments, each monofilament including:
  a core of low carbon steel with an initial diameter;
  a first electroplated layer of copper deposited from an alkaline copper solution and completely and substantially uniformly electroplated on the core;
  a second layer of metal or metal alloy completely and substantially uniformly electroplated on the first electroplated copper layer and which is resistant to oxidation and corrosion or to which solder can bond;
  wherein each monofilament is drawn after electroplating to a final diameter less than the initial diameter.

16. The RFI/EMI shielding material of claim 15 wherein the core of low carbon steel has an initial diameter larger than 100 µm and wherein the final diameter of each monofilament is in the range of about 40-80 µm.

17. The RFI/EMI shielding material of claim 15 wherein the second electroplated layer is chosen from the group consisting of silver, nickel, tin/tin alloy, brass, bronze, and noble metal.

18. An RFI/EMI shielding material composed of a conductive multi-fiber having a plurality of metalized monofilaments, each monofilament including:
  a core of low carbon steel with an initial diameter;

a first electroplated layer of copper deposited from an acid copper or alkaline copper solution and completely and substantially uniformly electroplated on the core;

a second layer of copper deposited from an acid copper or alkaline copper solution and completely and substantially uniformly electroplated on the first electroplated copper layer;

a third layer of metal or metal alloy completely and substantially uniformly electroplated on the second layer and which is resistant to oxidation and corrosion or to which solder can bond;

wherein each monofilament is drawn after electroplating to a final diameter less than the initial diameter.

19. The RFI/EMI shielding material of claim 18 wherein the third electroplated layer is chosen from the group consisting of silver, nickel, tin/tin alloy, brass, and noble metal.

20. The RFI/EMI shielding material of claim 18 wherein each of the monofilaments has a fourth electroplated layer of electroplatable metal or metal alloy to which solder can bond.

21. The RFI/EMI shielding material of claim 20 wherein the fourth electroplated layer is chosen from the group consisting of silver, tin/tin alloy, brass, and gold.

22. An RFI/EMI shielding material composed of a conductive multi-fiber having a plurality of metalized monofilaments, each monofilament including:

a core of low carbon steel with an initial diameter;

a first electroplated layer of nickel deposited from a Woods nickel solution and completely and substantially uniformly electroplated on the core;

a second layer of metal or metal alloy completely and substantially uniformly electroplated on the first electroplated layer and which is resistant to oxidation and corrosion or to which solder can bond;

wherein each monofilament is drawn after electroplating to a final diameter less than the initial diameter.

23. The RFI/EMI shielding material of claim 22 wherein the second electroplated layer is chosen from the group consisting of silver, tin/tin alloy, brass, bronze, and noble metal.

24. An RFI/EMI shielding material composed of a conductive multi-fiber having a plurality of metalized monofilaments, each monofilament including:

a core of low carbon steel with an initial diameter;

a first electroplated layer of nickel deposited from a Woods nickel solution and completely and substantially uniformly electroplated on the core;

a second layer of copper deposited from an acid copper or alkaline copper solution and completely and substantially uniformly electroplated on the first electroplated layer;

a third layer of metal or metal alloy completely and substantially uniformly electroplated on the second layer and which is resistant to oxidation and corrosion or to which solder can bond;

wherein each monofilament is drawn after electroplating to a final diameter less than the initial diameter.

25. The RFI/EMI shielding material of claim 24 wherein the third electroplated layer is chosen from the group consisting of silver, nickel, tin/tin alloy, brass, and noble metal.

26. The RFI/EMI shielding material of claim 24 wherein each of the monofilaments has a fourth electroplated layer of electroplatable metal or metal alloy to which solder can bond.

27. The RFI/EMI shielding material of claim 26 wherein the fourth electroplated layer is chosen from the group consisting of silver, tin/tin alloy, brass, and gold.

* * * * *